United States Patent
Masuda et al.

(10) Patent No.: US 6,237,125 B1
(45) Date of Patent: *May 22, 2001

(54) HIGH-LEVEL SYNTHESIS METHOD INCLUDING PROCESSING FOR OPTIMIZING ARITHMETIC SEQUENCE OF AN OPERATION STRING

(75) Inventors: Atsushi Masuda; Yoshinori Shigeta, both of Tokyo (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,571

(22) Filed: Dec. 5, 1997

(30) Foreign Application Priority Data

Dec. 5, 1996 (JP) .................................... 8-325617

(51) Int. Cl.[7] ................................... G06F 17/50
(52) U.S. Cl. .................... 716/1; 716/3; 716/18
(58) Field of Search ................ 395/500.19, 500.04, 395/500.02; 716/1, 3, 18

(56) References Cited

U.S. PATENT DOCUMENTS 5,706,205 * 1/1998 Masuda et al. ................ 395/500.19
5,805,462 * 9/1998 Poirot et al. ...................... 716/18

OTHER PUBLICATIONS

Sreeranga P. Rajan "Correcness of Transformations in High Lvel Synthesis," pp. 597–603, Sep. 1995.*
Chen et al "Generating the Optimal Graph Representations from the Instruction Set Tables of Circuits," IEEE, pp. 241–244, 1994.*
Potkonjak et al "Heterogeneous Bist Teachniques for Yield Adn Reliability Enhancement Using High Level Synthesis Transformations," pp. 454–465, 1993.*
McFarland et al "The High–Level Synthesis of Digital Systems," IEEE, pp. 301–318, Feb. 1990.*
Park et al "Famos: An Efficient Scheduling Algorithm for High–Level Synthesis," IEEE, pp. 1437–1448, Oct. 1993.*
Chapman et al Timed Dependence Flow Graphs, an Intermediate Form for Verified High–Level Synthesis, IEEE, pp. 109–112, Jan. 1995.*
Rao et al., "Partitioning by Regularity Extraction", IEEE, 29th ACM/IEEE Design Automation Conference paper 14.4, (1992).

* cited by examiner

Primary Examiner—Matthew Smith
Assistant Examiner—Vuthe Siek
(74) Attorney, Agent, or Firm—Foley & Lardner

(57) ABSTRACT

A dependent relation of operations is extracted from an operation string expressing an operation specification, and thus the dependent relation of operations is created. Connecting relations between arithmetic units constituting an initial circuit construction of a logic circuit are extracted, and thus the connecting relations of the arithmetic units and the corresponding dependent relation of operations are created. Basic conversion rules are applied to the dependent relation of operations, new conversion rules are prepared, and thus conversion rules are created. The conversion rules are repeatedly applied to the dependent relation of operations for optimization, and optimized dependent relation of operations is created. An optimized operation string is prepared from the optimized dependent relation of operations, and an optimized operation string is obtained.

3 Claims, 13 Drawing Sheets

FIG.14

| | ADDERS | SUBTRACTERS | NO. OF REGISTERS | NO. OF WIRE CONNECTIONS | NO. OF MULPLEXERS |
|---|---|---|---|---|---|
| CONVENTIONAL METHOD | 2 | 1 | 2 | 18 | 9 |
| APPLYING CONVERSION RULES (WITHOUT INITIAL CIRCUIT CONSTRUCTION) | 2 | 1 | 2 | 17 | 8 |
| APPLYING CONVERSION RULES (WITH INITIAL CIRCUIT CONSTRUCTION) | 2 | 1 | 1 | 15 | 7 |

US 6,237,125 B1

HIGH-LEVEL SYNTHESIS METHOD INCLUDING PROCESSING FOR OPTIMIZING ARITHMETIC SEQUENCE OF AN OPERATION STRING

BACKGROUND OF THE INVENTION

1. Field of the Invention

The present invention relates to a high-level synthesis method for synthesizing a logic circuit from an operation string expressing an operation specification, and more particularly to a high-level synthesis method including a processing for optimizing the arithmetic sequence of an operation string.

2. Description of the Related Art

Procedure of synthesizing a logic circuit from operation specification conventionally employed (The High-level Synthesis of Digital System: MICHAEL C. McFARLAND, ALICE C. PARKER, PAUL CAMPOSANO: Proceeding of the IEEE, Vol. 78, No.2, 1990) is shown in FIG. 1.

According to the conventional procedure, an operation string is first extracted from the operation specification (Steps S101 and S103), scheduling is performed (Step S105) for the extracted operation string, hardware location (Step S107) is executed thereby roughly adapting a logic circuit, and finally a logic synthesis (Step S109) is performed in which circuit elements are allocated to the operation based on the results of the hardware allocation. Here, the Step S101 to Step S107 are the processing called "High-Level Synthesis."

By the scheduling in the Step S105, the corresponding relation between the operations and the duration of use of each arithmetic unit is determined so as to quicken the execution of the operation string under the restricted number of the arithmetic units which can be used simultaneously. For example, if the operation string extracted in the Step S103 is Z=H+((E+F)+(A−B+C+D+)+G)−I, then a logic circuit as shown in FIG. 2 was synthesized by the conventional procedure.

However, in the conventional High-level Synthesis, the linkage with the allocation of circuit elements are not considered sufficiently in the scheduling, and the optimization of the operation string is not performed even though the allocation of the circuit elements can be performed to the optimum in some cases by replacing the arithmetic sequence of the operation string. Because of this, there are shortcomings such as the scale of synthesized logic circuit is too large or the processing speed is not high.

Also, the scheduling is performed only based on the restricted number of the arithmetic units that can be used; and scheduling based on the information of initial circuit construction such as connecting relations between the arithmetic units is not performed. Because of this, the optimization of the operation string suited to the initial circuit construction has not been a performed and thus the conventional procedure has shortcomings of unutilizing the execution performance based on the initial circuit construction.

SUMMARY OF THE INVENTION

The present invention is conceived to overcome the conventional problems stated above and its object is to provide a high-level synthesis method capable of synthesizing a small-scale logic circuit having a high processing speed by performing the optimization of extracted operation string before scheduling after extracting the operation string. In a case where the information of the initial circuit construction is given, another object is to provide a high-level synthesis method capable of enhancing the execution performance based on the initial circuit construction by performing the optimization of the operation string suited to the initial circuit construction.

To achieve the objects stated above, there is provided a high-level synthesis method for synthesizing a logic circuit by optimizing the arithmetic sequence of an operation string expressing an operation specification, the high-level synthesis method comprising: a step of analyzing the operation string expressing the operation specification based on coupling rules of operations and a dependent relation of data and extracting a dependent relation of operations, a step of preparing conversion rules applicable to the dependent relation of operations as new conversion rules out of basic conversion rules of operation order, a step of optimizing the dependent relation of operations by applying the prepared new conversion rules to the dependent relation of operations, and a step of preparing an optimized operation string from the optimized dependent relation of operations.

In a preferred embodiment of the present invention, the basic conversion rules are conversion rules for operation order of four fundamental rules of arithmetics, the conversion rules including at least a conversion rule from A+B to B+A, a conversion rule from A+B−C to A−C+B, and a conversion rule from A+(B+C) to A+B+C.

In a preferred embodiment of the present invention, the step of preparing the new conversion rules prepares arithmetic rules which at least do not increase the number of operation stages out of the fundamental arithmetic rules as the new arithmetic rules.

According to the present invention, the operation order is unified, so that the construction of the logic circuit synthesized can be simplified. Also, a dependent relation of operations which was in serial construction is changed to a timber construction, the processing speed of the operation can be improved. As a result, the scale of synthesized logic circuit is reduced and the processing speed is increased.

To achieve the objects stated above, there is provided a high-level synthesis method for synthesizing a logic circuit by optimizing the arithmetic sequence of an operation string expressing an operation specification, the high-level synthesis method comprising: a step of analyzing the operation string expressing the operation specification based on coupling rules of operations and a dependent relation of data and extracting a first dependent relation of operations, a step of extracting, from an initial circuit construction of a logic circuit executing the operation string, connecting relations between arithmetic units constituting the initial circuit construction, a step of creating a second dependent relation of operations from the extracted connecting relations between the arithmetic units, a step of applying basic conversion rules for operation order to the second dependent relation of operations to prepare new conversion rules, a step of applying the new conversion rules to the second dependent relation of operations to optimize the second dependent relation of operations, and a step of preparing an optimized operation string from the second optimized dependent relation of operations.

In a preferred embodiment of the present invention, the initial circuit construction has an output of a first adder to which a second adder and a subtracter are connected in parallel, registers being connected to outputs of the second adder and the subtracter respectively, outputs of the registers being connected to two inputs of the first adder respectively; the connecting relations between the arithmetic units being a connecting relation between the first adder and the second adder and a connecting relation between the first adder and the subtracter; the basic conversion rules including at least a conversion rule from A+B to B+A, a conversion rule from A+B−C to A−C+B, and conversion rule from A+(B+C) to A+B+C; and the new conversion rules including at least a conversion rule from A+B+C to A+(B+C), a conversion rule from B+A+C to A+(B+C), a conversion rule from B+C+A to A+(B+C), a conversion rule from B+A−C to A+B−C, a conversion rule from A−C+B to A+B−C, and a conversion rule from B+(A−C) to A+B−C.

According to the present invention, the operation order is optimized so as to suit to the initial circuit construction, and therefore the improvement of execution performance based on the initial circuit construction and the synthesis of logic circuit along the initial circuit construction can be performed.

The nature, principle and utility of the invention will become more apparent from the following detailed description when read in conjunction with the accompanying drawings.

BRIEF DESCRIPTION OF THE DRAWINGS

In the accompanying drawings:

FIG. 14 is a table showing the results of a comparison for the synthesized logic circuit.

DESCRIPTION OF THE PREFERRED EMBODIMENTS

Now the preferred embodiments of the present invention will be described hereinafter with reference to the accompanying drawings.

Figure 3:
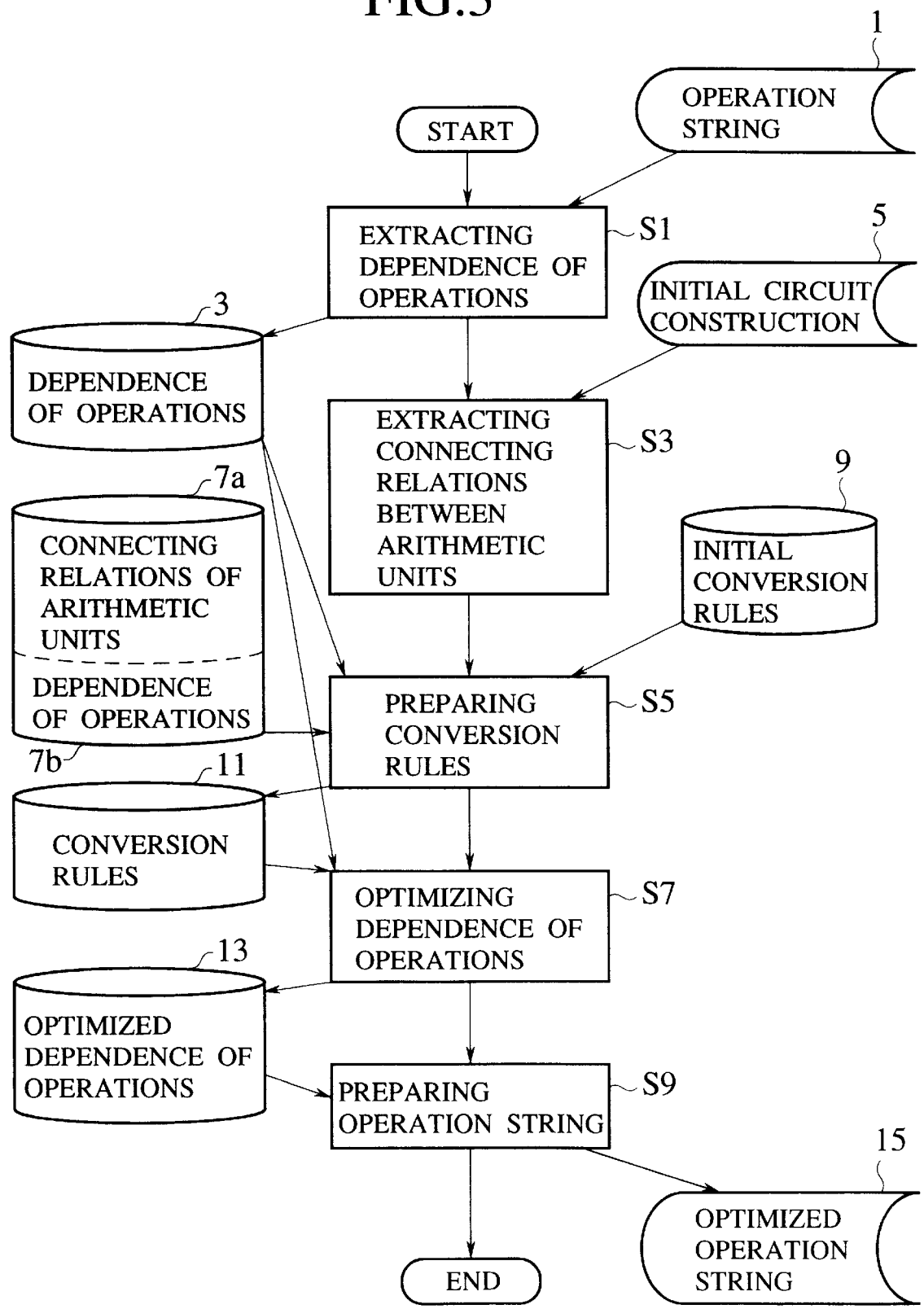
FIG. 3 is a processing flowchart of the high-level synthesis method according to an embodiment of the present invention.

FIG. 3 is a processing flow of the high-level synthesis method according to an embodiment of the present invention. The whole of the processing flowchart will be first explained.

First, an operation string 1 expressing an operation specification is analyzed based on coupling rules of operations and a dependent relation of data, a dependent relation of operations is extracted (Steps S1), and the dependent relation 3 of operations is created. Next, if an initial circuit construction 5 of a logic circuit executing the operation string 1 is given, then the connecting relations between the arithmetic units constituting the initial circuit construction 5 are extracted (Step S3), and the connecting relations 7a of the arithmetic units and the dependent relation 7b of the operations corresponding to the connecting relations are created. If no initial circuit construction 5 is given, the connecting relations between the arithmetic units are not extracted (Step S3) and no connecting relations 7a of the arithmetic units are created.

Next, if the initial circuit construction 5 is given, basic conversion rules 9 of operation order is applied to the dependent relation 7b of operations to prepare new conversion rules (Step S5) and conversion rules 11 are created. If no initial circuit construction 5 is given, then conversion rules applicable to the dependent relation 3 of operations are prepared (Step S5) as new conversion rules out of basic conversion rules 9, and thus conversion rules 11 are created.

The dependent relation 3 of operations is optimized by repeatedly applying the conversion rules 11 thereto (Step S7), and thus an optimized dependent relation 13 of operations is created. Finally, an optimized operation string is prepared from the optimized dependent operation 13 of operations (Step S9), and thus an optimized operation string 15 is obtained.

Hereinafter, the actual processing for the case where no initial circuit construction 5 is given will be explained by referring to FIG. 4 to FIG. 6.

As an example, let consider an operation string 1, as an input, being Z=H+((E+F)+(A−B+C+D+)+G)−I. At first, the input operation string 1 is analyzed based on coupling rules of operation and a dependent relation of data to extract a dependent relation of operations (Step S1) and thus a dependent relation 3 of operations as shown in FIG. 4 is created. The dependent relation 3 of operations as shown in FIG. 4 is the result obtained by giving a higher priority order to an operator located leftward further with respect to the operators at the same level relative to the parenthesis; for example, it expresses that the operation 201 is executed before the addition 202, addition 202 is executed before addition 204, and addition 203 has no dependence with subtraction 201, additions 202 and 204.

Figure 5A:
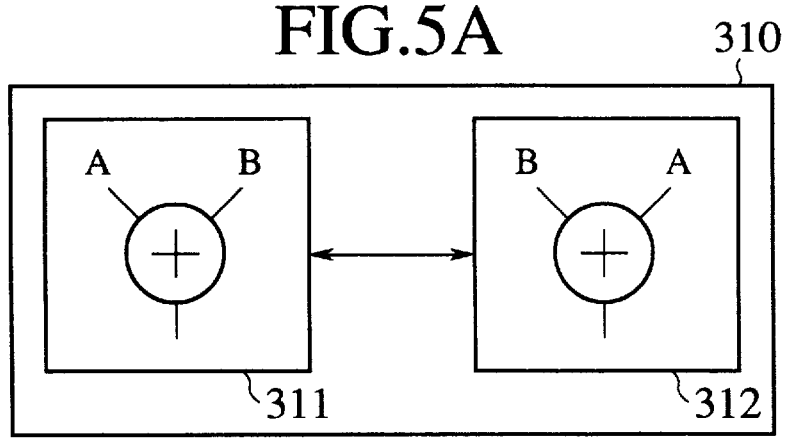
FIGS. 5A to 5C are the diagrams showing the basic conversion rules used in an embodiment of the present invention.
Figure 5B:
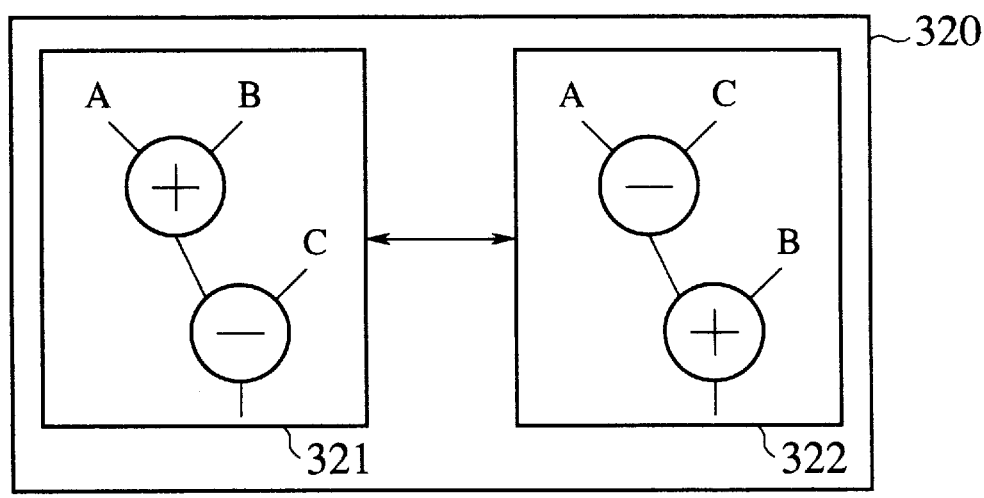
Figure 5C:
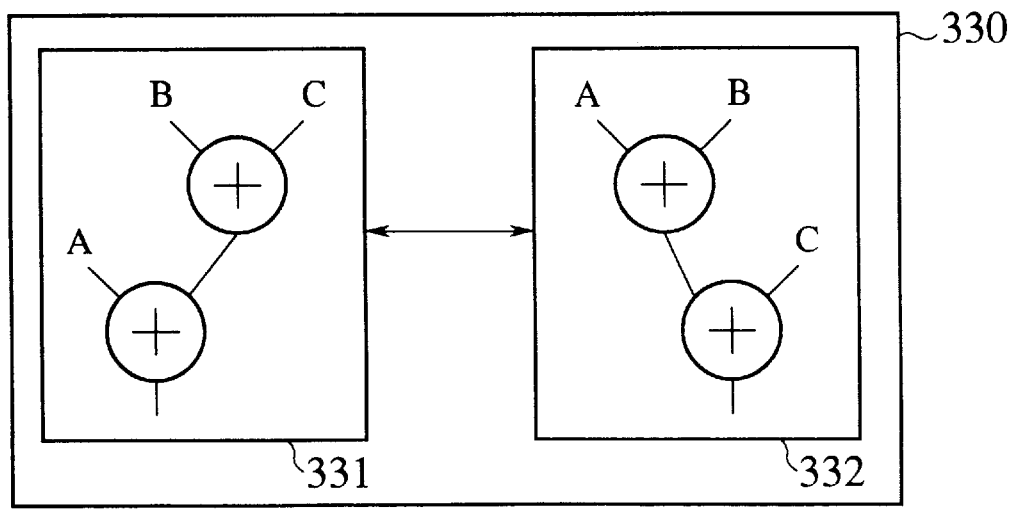

Next, conversion rules applicable to the dependent relation of operations are prepared as new conversion rules out of the basic conversions rules 9 (Step S5), and thus conversion rules 11 are created. Basic conversion rules 9 are the conversion rules for the basic operation order corresponding to commutative law or the like on the four fundamental rules of arithmetics for example. That is, orientation for conversion is performed for the basic conversion rules 9 as shown in FIGS. 5A to 5C, for example to create candidates of the conversion rules. That is, the orientation is performed such as 311→312 (FIG. 5A) for the rule 310; 321→322 (FIG. 5B) for rule 320; and 331→332 (FIG. 5C) for rule 330.

Conversion rules applicable and useful to the dependent relation 3 of operations are selected out of the candidates of these basic conversion rules 9 and are used as new conversion rules 11. In this example, if 331→332 is applied with 204 and 205 as a pair, then the number of steps in operation increases, so that 311→312 and 321→322 are adopted as the conversion rules 11.

Figure 4:
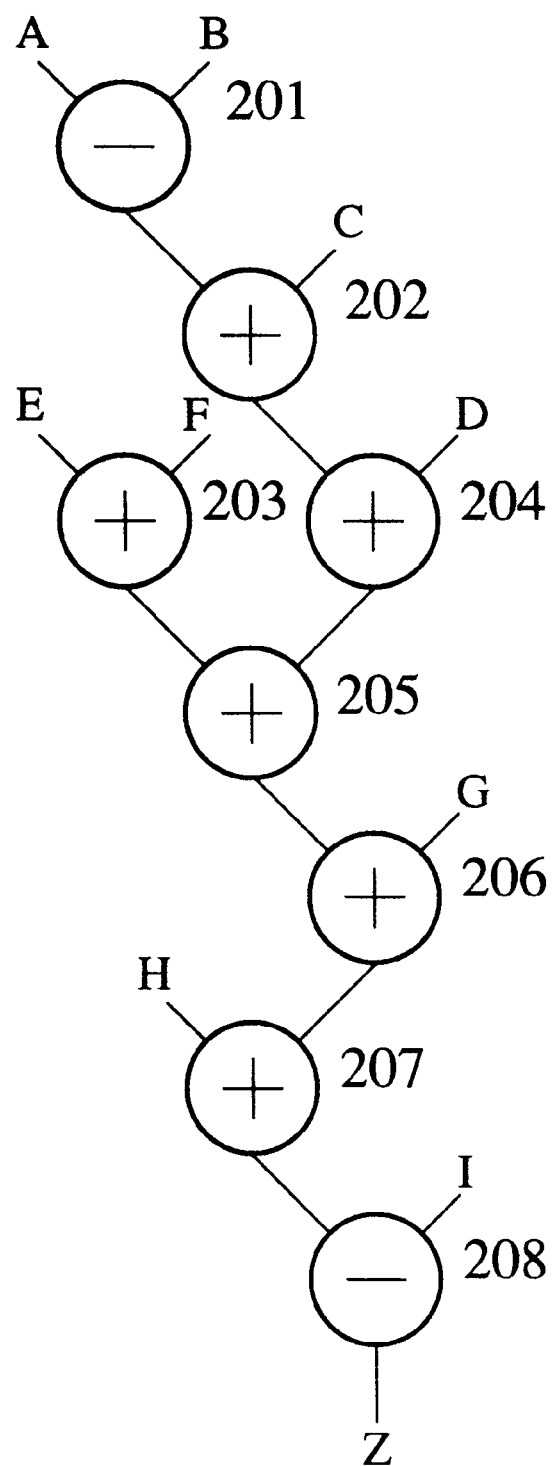
FIG. 4 is a diagram showing the dependent relation of an operation created by an embodiment of the present invention.
Figure 6:
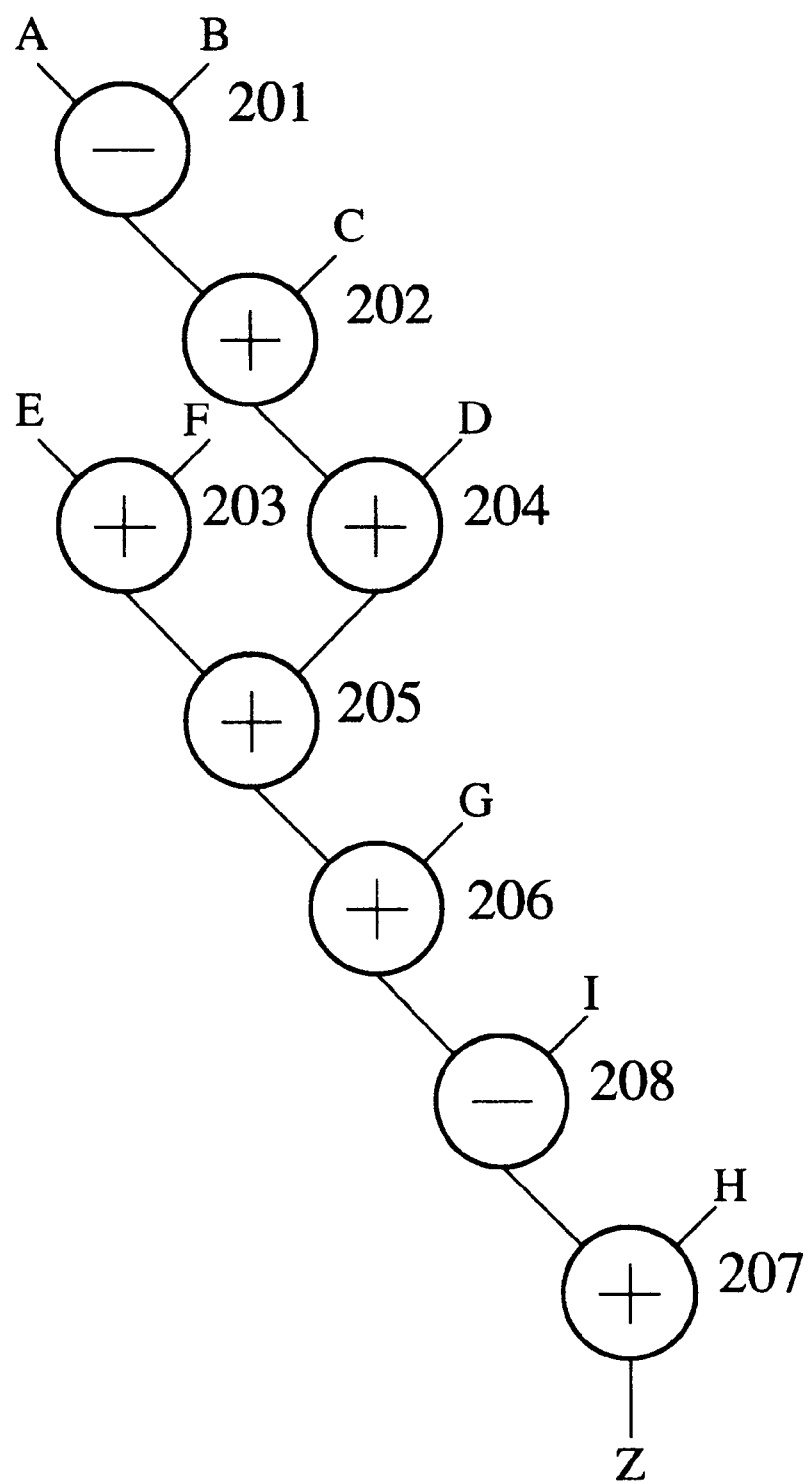
FIG. 6 is a diagram showing the optimized dependent relation of operations by an embodiment of the present invention.

The adopted conversion rules 11 is repeatedly applied to a dependent relation 3 of operations in FIG. 4 (Step S7), and optimized dependent relation 13 of operations is created and shown in FIG. 6. From this drawing, it can be known that the conversion rule 311 —>312 is applied to the operation 207 in FIG. 4 and the conversion rule 321 —>322 to the operations 207 and 208.

Finally, an optimized operation string is prepared from the optimized dependent relation 13 of operations shown in FIG. 6 (Step S9), and thus an optimized operation string 13 is obtained. Specifically, it is optimized to Z=((E+F)+(A—B+C+D))+G—I+H.

Next, actual processing for the case where the initial circuit construction 5 is given will be explained using FIG. 4, FIG. 5 and FIG. 7 to FIG. 11.

As same as the case where no initial circuit construction 5 is given, if the operation string 1 as an input is Z=H+((E+F)+(A—B+C+D+)+G)—I, then the dependent relation 3 of operations as shown in FIG. 4 can be created in the same manner.

Figure 7:
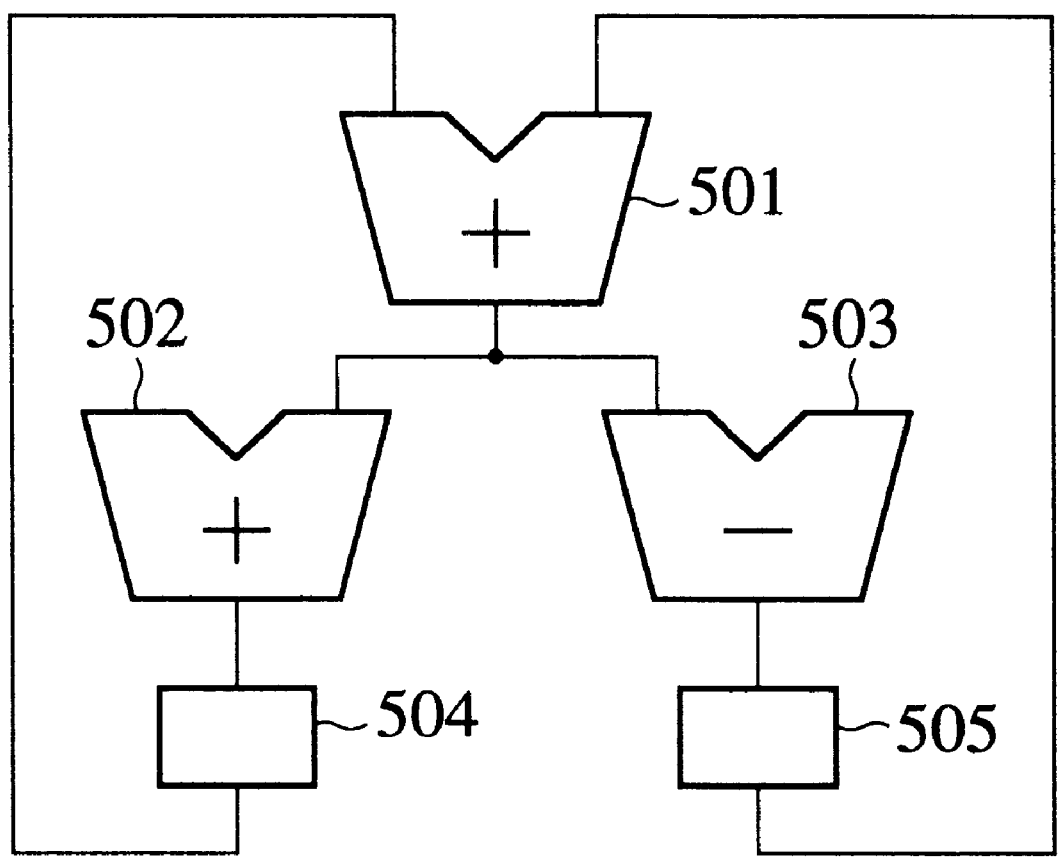
FIG. 7 is a diagram showing the initial circuit construction used in an embodiment of the present invention.
Figure 8A:
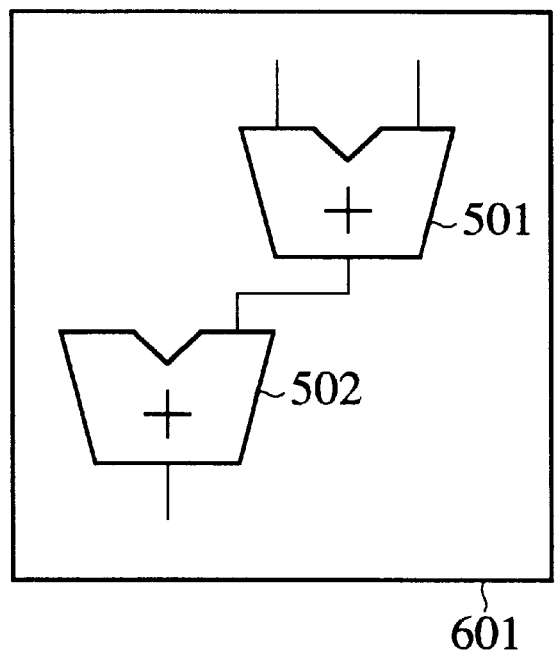
FIGS. 8A and 8B are diagrams showing the connecting relations of arithmetic units extracted in an embodiment of the present invention.
Figure 8B:
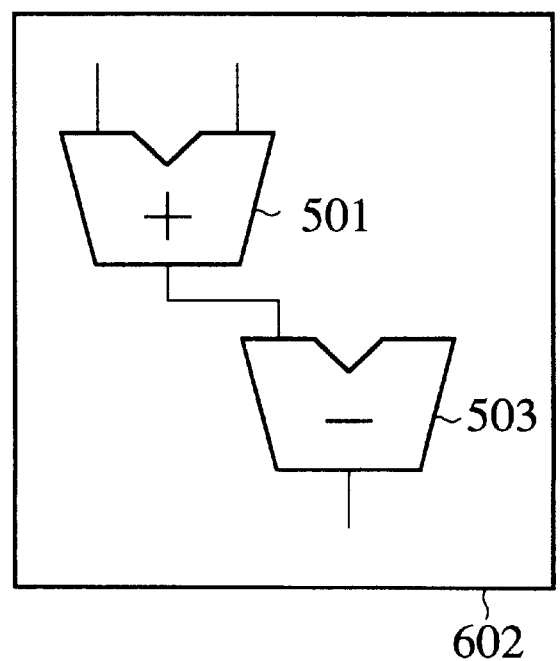
Figure 9A:
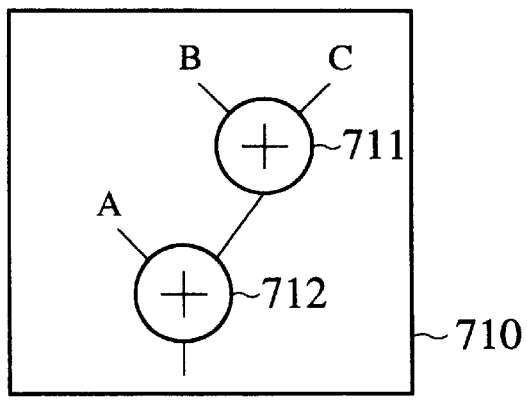
FIGS. 9A–9D are diagrams showing the dependent relation of operation created by an embodiment of the present invention.
Figure 9B:
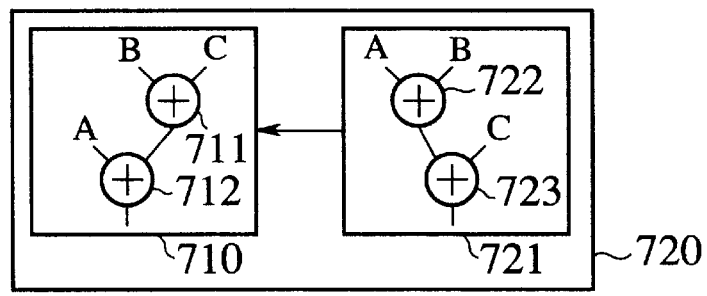
Figure 9C:
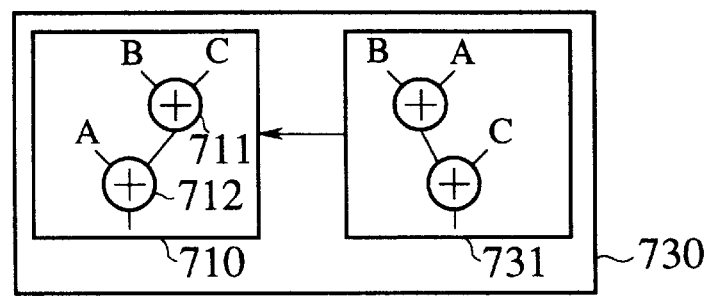
Figure 9D:
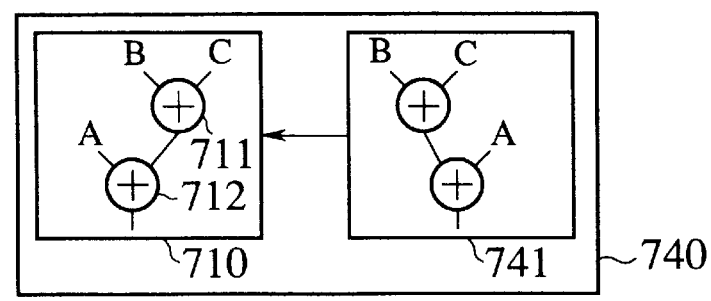
Figure 10A:
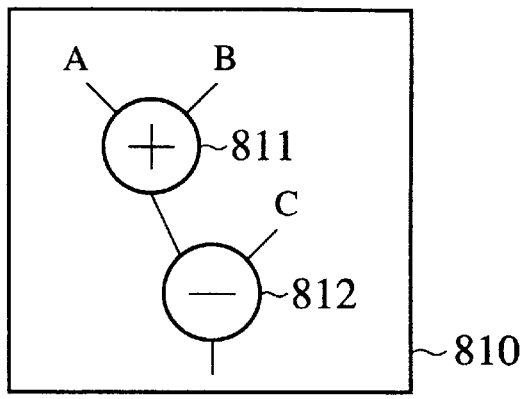
FIGS. 10A–10D are diagrams showing the dependent relation of operations created by an embodiment of the present invention.
Figure 10B:
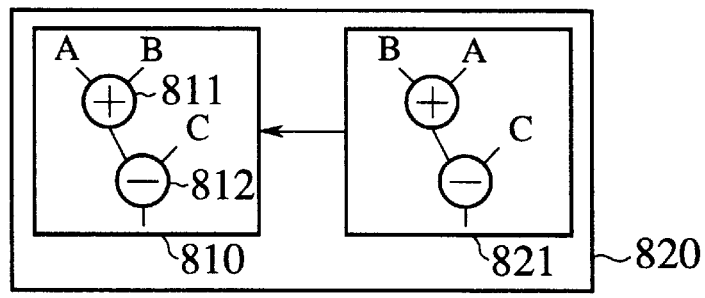
Figure 10C:
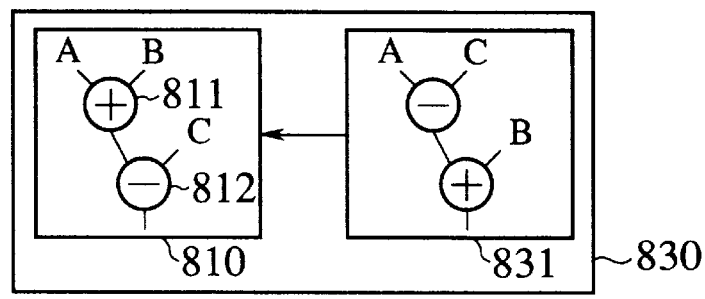
Figure 10D:
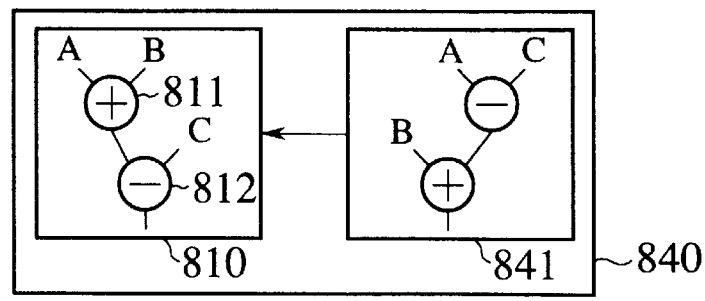

When the initial circuit construction 5 as shown in FIG. 7 is given, the connecting relations between the arithmetic units constituting the construction are extracted (Step S3) and thus a connecting relation 7a of the arithmetic units shown in FIGS. 8A and 8B is created. In the initial circuit construction 5 shown in FIG. 7, an adder 502 and a subtracter 503 are connected in parallel to an output of an adder 501, registers 504 and 505 are connected to the outputs of these adder 502 and subtracter 503 respectively, and respective register 504 and 505 are connected to two inputs of the adder 501.

From the initial circuit construction 5, the connecting relations between the arithmetic units are analyzed by following the connections (1) from a register to a register, (2) from inputs of the whole of logic circuit to a register, and (3) from a register to outputs of the whole of logic circuit, and then the connecting relations 7a of the arithmetic units shown in FIG. 8A and FIG. 8B are extracted. In FIGS. 8A and 8B, the connecting relation 601 (FIG. 8A) between adders 501 and 502. and the connecting relation 602 (FIG. 8B) between the adder 501 and subtracter 503 are extracted. The dependent relation 7b of operations is created from the connecting relations 7a of the extracted arithmetic units. For example, a dependent relation 710 of operations shown in FIG. 9A and the dependent relation 810 of the operations shown in FIG. 10A can be created from the connecting relations 601 and 602 of the arithmetic units shown in FIGS. 8A and 8B.

The basic conversion rules 9 shown in FIG. 5A to FIG. 5C are repeatedly applied to the dependent relation 7b of operations to prepare new conversion rules 11 (Step S5). For example, the basic conversion rule 330 (FIG. 5c) is applied to the dependent relation 710 (FIG. 9A) of operations to obtain a new dependent relation 721 (FIG. 9B) of operations. By doing this, a new conversion rule 720 for replacing the dependent relation 721 with the dependent relation 710 is created.

Also, by applying the basic conversion rule 330 (FIG. 5C) to the dependent relation 710 (FIG. 9A) of operations, and by further applying the basic conversion rule 310 (FIG. 5A) to the operation 731, a new dependent relation 731 (FIG. 9C) of operations can be obtained. By doing this, a new conversion rule 730 for replacing the dependent relation 731 with a dependent relation 710 is created. In the same manner, new conversion rules 740 (FIG. 9D), 820 (FIG. 10B), 830 (FIG. 10C), and 840 (FIG. 10D) can be created by applying the basic conversion rules 9 as required to the dependent relation 710 or dependent relation 810 of operations. Other than these, there are many conversion rules that can be created.

Figure 11:
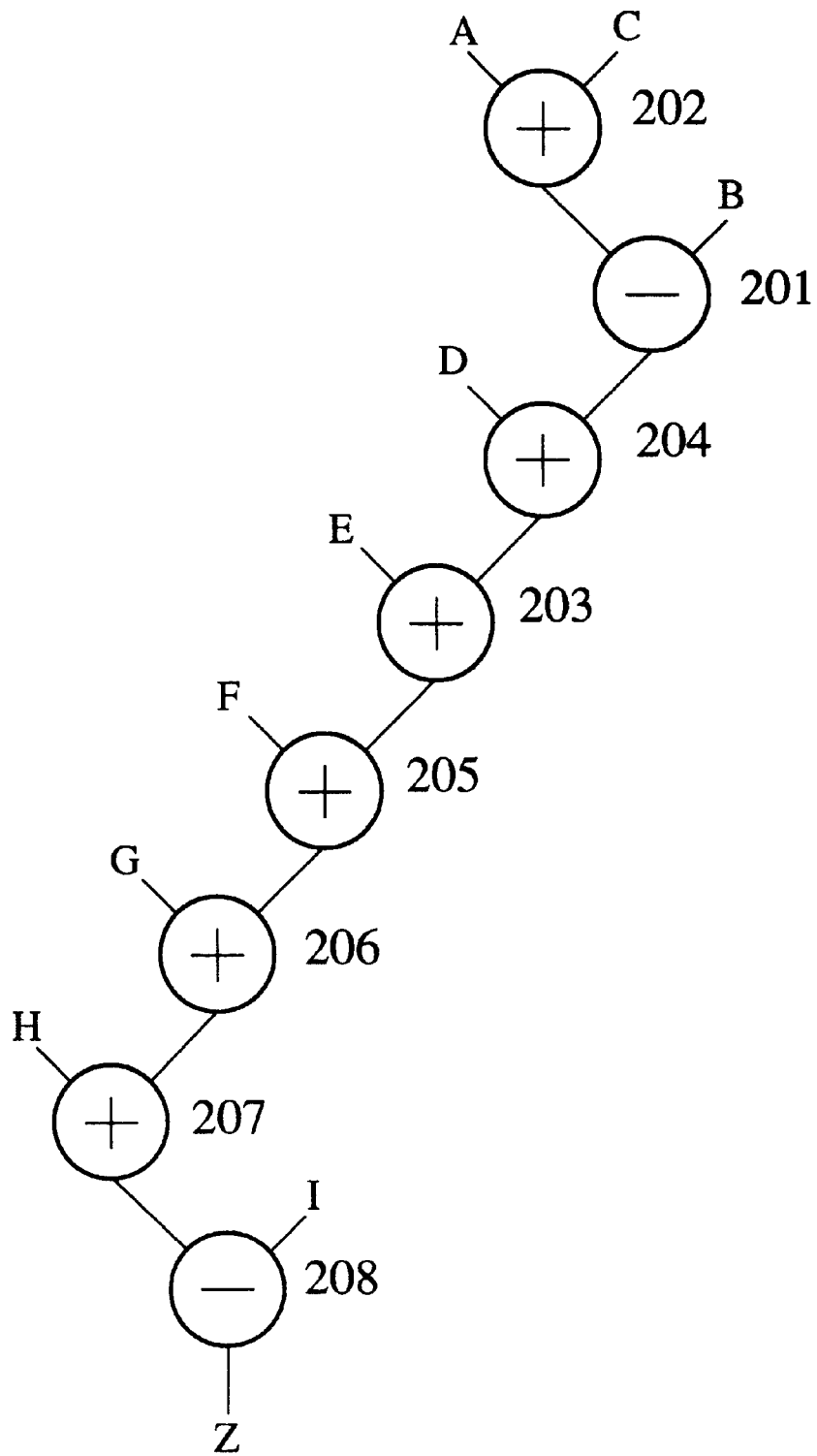
FIG. 11 is a diagram showing the optimized dependent relation of the operations by an embodiment of the present invention.

Next, the dependent relation 3 of operations shown in FIG. 4 is optimized by repeatedly applying the created conversion rules 11 thereto (Step S7), and thus optimized dependent relation 13 of the operations is created. The optimized dependent relation 13 of operations is shown in FIG. 11. FIG. 11 is the results of the application of the conversion rules 11 given in the following order to the dependent relation 3 of the operations show in FIG. 4.

Conversion rule 740 (FIG. 9D) to the operations 205 and 206.

Conversion rule 730 (FIG. 9C) to the operations 203 and 205.

Conversion rule 740 (FIG. 9D) to the operations 202 and 204.

Conversion-rule 830 (FIG. 10C) to the operations 201 and 202.

Finally, an optimized operation string is prepared from optimized dependent relation 13 of operations shown in FIG. 11 (Step S9), and thus an optimized operation string 13 is obtained. Specifically, Z=H+(G+(F+(E+(D+(A+C-B))))-I can be obtained.

The process of obtaining the optimized operation string 13 from the operation string 1 has been explained above for both the case where the initial circuit construction 5 is not given and the case where it is given. The operation string 13 obtained for each case is synthesized to the logic circuit under the restrictive condition that the two operations can be executed serially in one cycle, and the results are respectively shown in FIG. 12 and FIG. 13.

Figure 12:
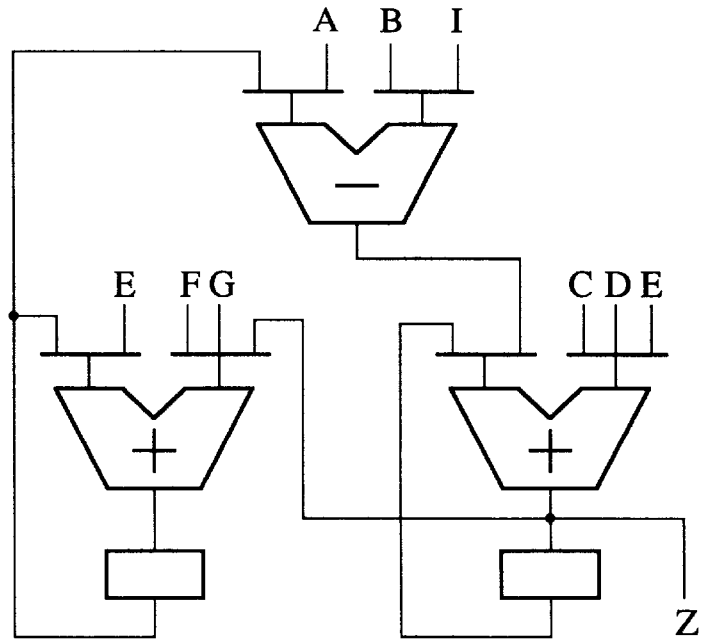
FIG. 12 is a logic circuit diagram synthesized by an embodiment of the present invention.
Figure 13:
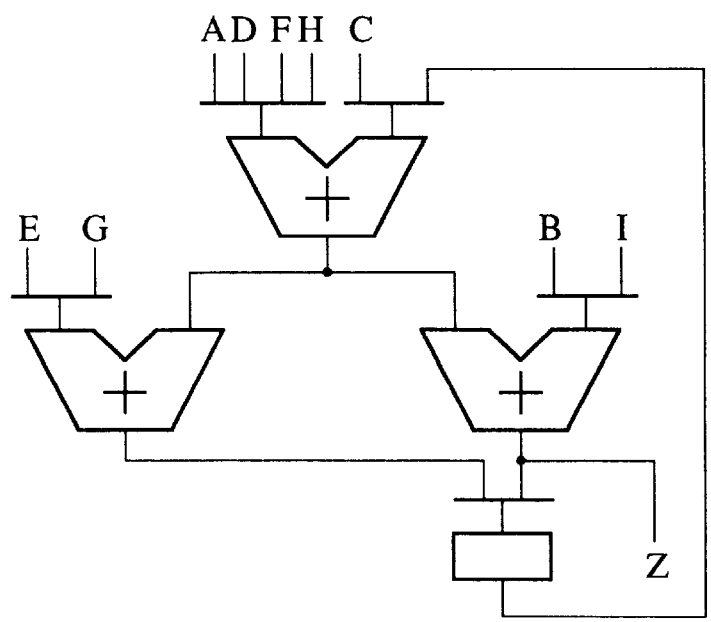
FIG. 13 is a logic circuit diagram synthesized by an embodiment of the present invention.

That is, FIG. 12 is a logic circuit when the initial circuit construction 5 is not given and FIG. 13 is when it is given. A register is shown by a rectangle, a multiplexer is expressed with a heavy line and a connection with a thin line.

Figure 1:
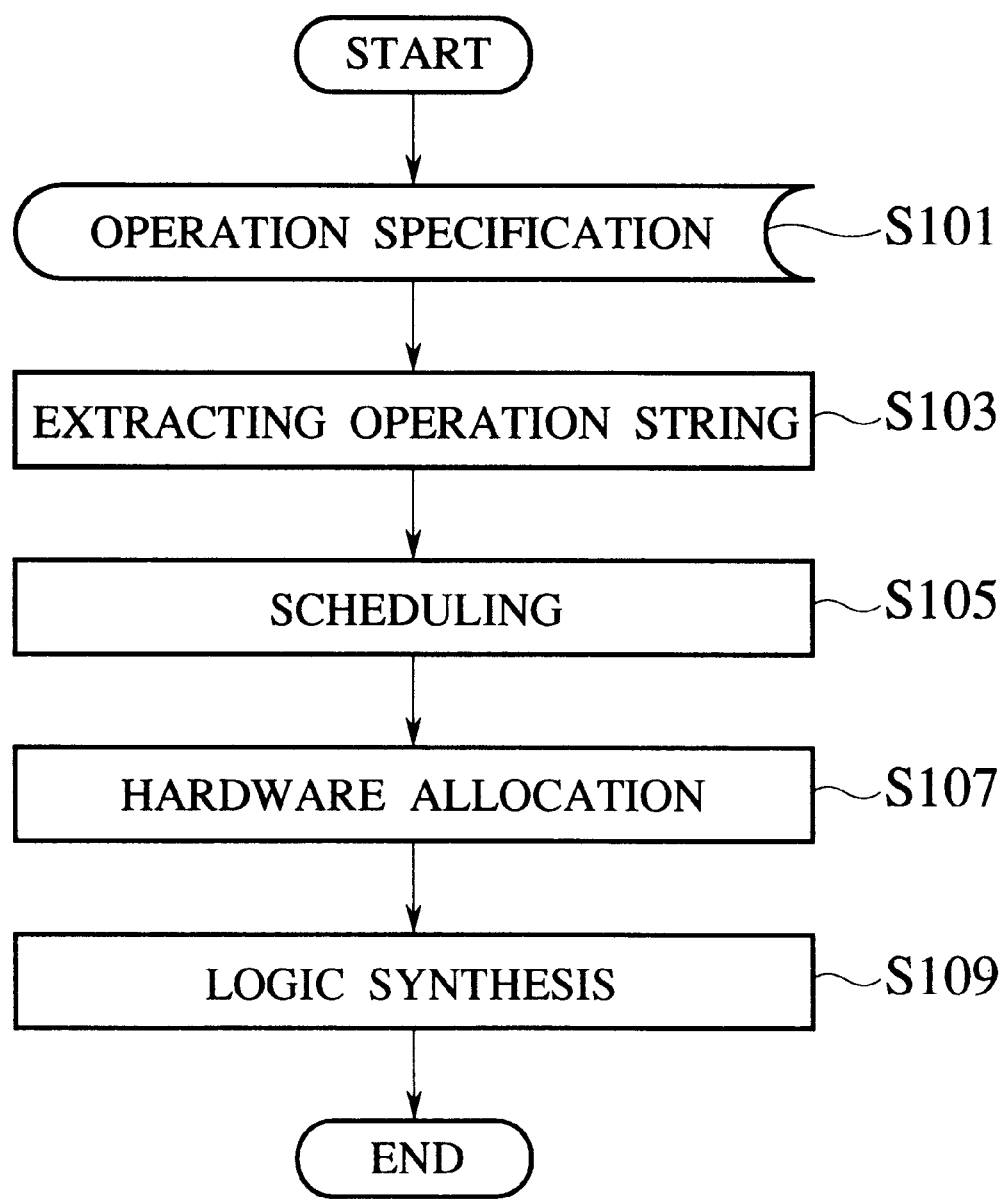
FIG. 1 is a processing flowchart showing a conventional procedure for synthesizing a logic circuit.
Figure 2:
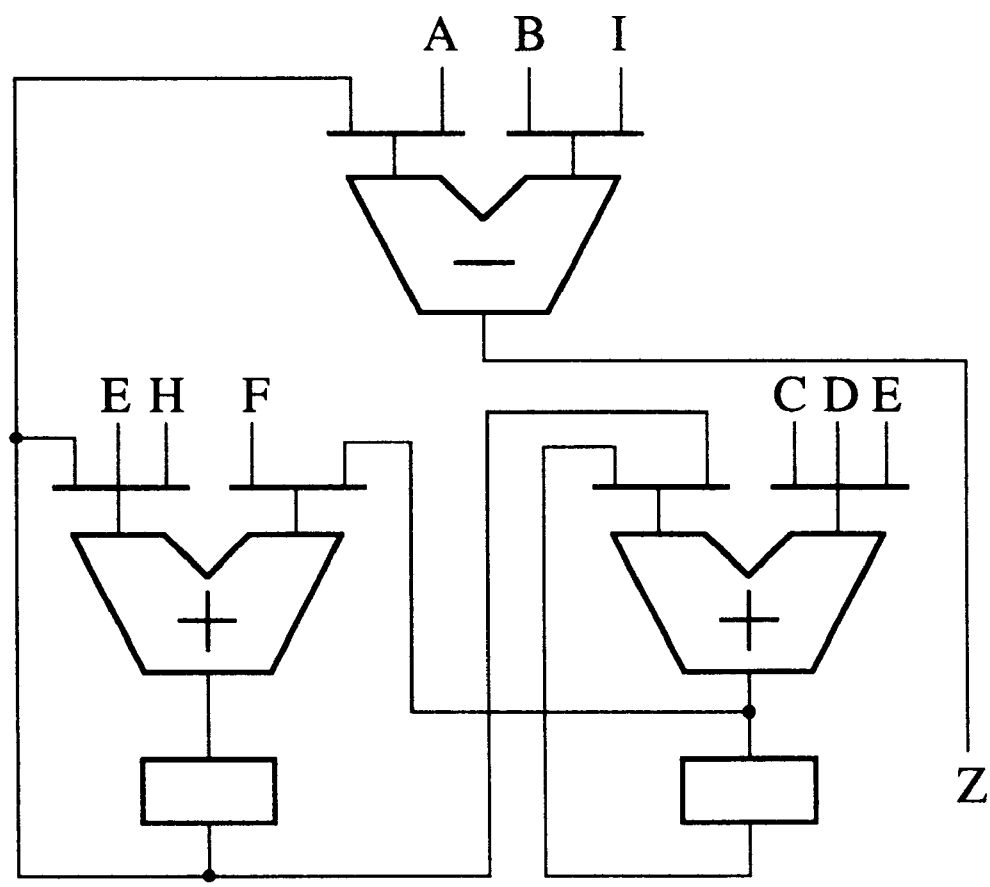
FIG. 2 is a logic circuit diagram synthesized by a conventional procedure.

Results of comparison between these logic circuits and a logic circuit synthesized with the conventional method indicated with FIG. 2 are shown in FIG. 14. From FIG. 14, it can be known that the logic circuit optimized by giving the initial circuit construction 5 is the smallest and then the logic circuit optimized without giving the initial circuit construction 5 has the order as same as the conventional method. From these results, it can be known that the high-level synthesis method according to the present invention will bring in useful effect to the design of logic circuit.

According to the present invention as stated above, the arithmetic sequence of the operation string can be changed adequately when synthesizing the logic circuit from the operation string given as operation specification, so that the construction of logic circuit executing the operation string can be simplified and the execution performance can be enhanced. Also, when an initial circuit construction of the logic circuit executing the operation string is given, the arithmetic sequence is changed in such a manner that the optimum arithmetic order can be obtained in a mode of the circuit construction and therefore the simplification and the enhancement of the execution performance can be achieved while adapting the construction of the logic circuit executing the operation string to the initial circuit construction.

It should be understood that many modifications and adaptations of the invention will become apparent to those skilled in the art and it is intended to encompass such obvious modifications and changes in the scope of the claims appended hereto.

What is claimed is:

1. A method for designing a logic circuit by optimizing an arithmetic sequence of an operation string expressing an operation specification, the method comprising:

a step of analyzing operators and data included in the operation string expressing the operation specification to extract a first dependent relation of operations, a step of extracting connecting relations between arithmetic units constituting an initial circuit construction of the logic circuit preferably executing the operation string, a step of creating a second dependent relation of operations from the extracted connecting relations between the arithmetic units, a step of applying basic conversion rules for operation order to the second dependent relation of operations to create new conversion rules, wherein each of the new conversion rules is based on a combination of two or more basic conversion rules. a step of rearranging the first dependent relation of operations by applying the new conversion rules to the first dependent relation of operations so as to include common partial operation strings to a predetermined extent, thereby optimizing the first dependent relation of operations, wherein the common partial operation strings are partial operation strings having the same structure as each other, a step of generating an optimized operation string from the optimized first dependent relation of operations, and a step of modifying the initial circuit construction of the logic circuit according to the optimized operation string.

2. A high-level synthesis method according to claim 1, wherein the initial circuit construction has an output of a first adder to which a second adder and a subtracter are connected in parallel, registers being connected to outputs of the second adder and the subtracter respectively, outputs of the registers being connected to two inputs of the first adder respectively;

the connecting relations between the arithmetic units being a connecting relation between the first adder and the second adder and a connecting relation between the first adder and the subtracter;

the basic conversion rules including at least a conversion rule from A+B to B+A, a conversion rule from A+B−C to A−C+B, and conversion rule from A+(B+C) to A+B+C; and the new conversion rules including at least a conversion rule from A+B+C to A+(B+C), a conversion rule from B+A+C to A+(B+C), a conversion rule from B+C+A to A+(B+C), a conversion rule from B+A−C to A+B−C, a conversion rule from A−C+B to A+B−C, and a conversion rule from B+(A−C) to A+B−C.

3. A high-level synthesis method according to claim 1, wherein execution performance of the optimized operation string by a computer is enhanced as compared to the operation string prior to optimization.

* * * * *